US006800947B2

(12) United States Patent
Sathe

(10) Patent No.: US 6,800,947 B2
(45) Date of Patent: Oct. 5, 2004

(54) FLEXIBLE TAPE ELECTRONICS PACKAGING

(75) Inventor: Ajit V. Sathe, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/893,036

(22) Filed: Jun. 27, 2001

(65) Prior Publication Data

US 2003/0001287 A1 Jan. 2, 2003

(51) Int. Cl.[7] .................................................. H01L 23/48
(52) U.S. Cl. ........................ 257/780; 257/781; 257/782; 257/784; 257/786
(58) Field of Search .............................. 257/668, 692, 257/693, 694, 695, 696, 697, 698, 699, 700, 701, 702, 703, 780, 781, 782, 786, 686, 783, 784, 785; 438/612, 613, 1.18, 614, 666

(56) References Cited

U.S. PATENT DOCUMENTS

| | | | | | |
|---|---|---|---|---|---|
| 4,701,363 A | * | 10/1987 | Barber | ...................... | 428/137 |
| 5,045,921 A | * | 9/1991 | Lin et al. | ..................... | 257/680 |
| 5,354,955 A | * | 10/1994 | Gregor et al. | .............. | 174/250 |
| 5,375,042 A | * | 12/1994 | Arima et al. | ............... | 361/784 |
| 5,598,033 A | * | 1/1997 | Behlen et al. | .............. | 257/686 |
| 5,615,477 A | * | 4/1997 | Sweitzer | ..................... | 29/840 |
| 5,818,699 A | * | 10/1998 | Fukuoka | ..................... | 257/704 |
| 5,832,294 A | * | 11/1998 | Reinschmidt | ................ | 712/32 |
| 5,939,782 A | * | 8/1999 | Malladi | ....................... | 257/698 |
| 6,075,710 A | * | 6/2000 | Lau | ............................. | 257/778 |
| 6,218,729 B1 | * | 4/2001 | Zavrel et al. | ............... | 257/698 |
| 6,252,298 B1 | * | 6/2001 | Lee et al. | .................... | 257/668 |
| 6,268,568 B1 | * | 7/2001 | Kim | ........................... | 257/778 |
| 6,329,610 B1 | * | 12/2001 | Takubo et al. | ............. | 174/264 |
| 6,365,421 B2 | * | 4/2002 | Debenham et al. | .......... | 438/14 |
| 6,407,929 B1 | * | 6/2002 | Hale et al. | ................... | 257/724 |
| 6,433,441 B1 | * | 8/2002 | Niwa et al. | ................. | 257/784 |
| 6,627,999 B2 | * | 9/2003 | Akram et al. | ............... | 257/778 |

OTHER PUBLICATIONS

Prasad, R.P., *In: Surface Mount Technology—Principles and Practice, Second Edition*, Kluwer Academic Publishing, pp. 38–41, (1997).

* cited by examiner

*Primary Examiner*—Eddie Lee
*Assistant Examiner*—Quang Lu
(74) *Attorney, Agent, or Firm*—Schwegman, Lundberg, Woessner & Kluth, P.A.

(57) ABSTRACT

To decrease the weight and the thickness, and to increase the flexibility, of an electronics package, the package includes an integrated circuit (IC) mounted on a flexible tape substrate. In one embodiment, an IC is mounted on a flexible tape substrate using a ball grid array arrangement; however, other arrangements, including lead bonding, can be used. The flexible tape substrate can comprise conductive traces, vias, and patterns of lands on one or more layers. Methods of fabrication, as well as application of the flexible tape package to an electronic assembly, an electronic system, and a data processing system, are also described.

15 Claims, 12 Drawing Sheets

FLEXIBLE TAPE ELECTRONICS PACKAGING

TECHNICAL FIELD

Embodiments of the present invention relate generally to electronics packaging and, more particularly to an electronic package that includes an integrated circuit packaged on a flexible tape substrate, and to manufacturing methods related thereto.

BACKGROUND INFORMATION

Integrated circuits (ICs) have typically been assembled into electronic packages by physically and electrically coupling them to a substrate made of organic or ceramic material. One or more such IC packages can be physically and electrically coupled to a secondary substrate such as a printed circuit board (PCB) or motherboard to form an "electronic assembly". The "electronic assembly" can be part of an "electronic system". An "electronic system" is broadly defined herein as any product comprising an "electronic assembly". Examples of electronic systems include computers (e.g., desktop, laptop, hand-held, server, etc.), wireless communications devices (e.g., cellular phones, cordless phones, pagers, etc.), computer-related peripherals (e.g., printers, scanners, monitors, etc.), entertainment devices (e.g., televisions, radios, stereos, tape and compact disc players, video cassette recorders, MP3 (Motion Picture Experts Group, Audio Layer 3) players, etc.), and the like.

In the field of electronic systems there is an incessant competitive pressure among manufacturers to drive the performance of their equipment up while driving down production costs. This is particularly true regarding the packaging of ICs, where each new generation of packaging must provide increased performance while generally being smaller or more compact in size. As market forces drive equipment manufacturers to produce electronic systems with increased performance and decreased size, IC packaging accordingly also needs to support these requirements.

In addition, manufacturers of high-end IC packages, such as processors, are experiencing increasing demand for IC packages mounted in thin, light-weight, and/or resilient packaging, because such packaging is useful for many applications. For example, hand-held electronic systems, such as cellular telephones, palm-top computers, personal digital assistants, calculators, MP3 players, watches, hearing aids, and similar equipment typically requires ICs in thin, light-weight, and/or flexible packages.

An IC substrate may comprise a number of metal layers selectively patterned to provide metal interconnect lines (referred to herein as "traces"), and one or more electronic components mounted on one or more surfaces of the substrate. The electronic component or components are functionally connected to other elements of an electronic system through a hierarchy of electrically conductive paths that include the substrate traces. The substrate traces typically carry signals that are transmitted between the electronic components, such as ICs, of the system. Some ICs have a relatively large number of input/output (I/O) terminals (also called "lands"), as well as a large number of power and ground terminals or lands.

Surface mount technology (SMT) is a widely known technique for coupling ICs to a substrate. One of the conventional methods for surface-mounting an IC on a substrate is called "controlled collapse chip connect" (C4). In fabricating a C4 package, the electrically conductive terminals or lands of an IC component are soldered directly to corresponding lands on the surface of the substrate using reflowable solder bumps or balls. The C4 process is widely used because of its robustness and simplicity.

In addition to using SMT to couple an individual IC die to a substrate, it is also well known to use SMT to couple an IC package to a substrate such as a printed circuit board (PCB) or motherboard. Solder bumps, for example, can be employed between lands on the IC package and corresponding lands on the PCB.

As the internal circuitry of ICs, such as processors, operates at higher and higher clock frequencies, and as ICs operate at higher and higher power levels, the amount of loop inductance produced within IC packages and electronic assemblies can increase to unacceptable levels.

For the reasons stated above, and for other reasons stated below which will become apparent to those skilled in the art upon reading and understanding the present specification, there is a significant need in the art for apparatus and methods for packaging an IC that minimize the thickness and weight of the packaging, and that minimize loop inductance within the packaging.

BRIEF DESCRIPTION OF THE DRAWINGS

FIGS. 5–10 together illustrate different stages in a process of fabricating a flexible tape package assembly, in accordance with one embodiment of the invention, wherein:

FIG. 5 illustrates a top view of a flexible tape substrate having a pattern of lands thereon;

FIG. 6 illustrates a top view of a flexible tape substrate having solder paste applied to lands on a surface thereof;

FIG. 7 illustrates a top view of a flexible tape substrate with dice mounted on a surface thereof;

FIG. 8 illustrates a bottom view of a segment of flexible tape IC package having solder balls on a surface thereof;

FIG. 9 illustrates a top view of a portion of a secondary substrate, such as a PCB, having a flexible tape IC package mounted thereon;

FIG. 10 illustrates a top view of a portion of the secondary substrate and flexible tape IC package of FIG. 9, with leads mounted;

DETAILED DESCRIPTION OF EMBODIMENTS OF THE INVENTION

In the following detailed description of embodiments of the invention, reference is made to the accompanying drawings which form a part hereof, and in which are shown by way of illustration specific preferred embodiments. These embodiments are described in sufficient detail to enable those skilled in the art to practice them, and it is to be understood that other embodiments may be utilized and that mechanical, chemical, structural, electrical, and procedural changes may be made without departing from the spirit and scope of the present disclosure. The following detailed description is, therefore, not to be taken in a limiting sense, and the scope of embodiments of the present invention is defined only by the appended claims.

Embodiments of the present invention provide a solution to thickness, weight, and/or rigidity limitations in an IC package, and to loop induction problems that are associated with prior art IC packages, by substituting a flexible tape for a rigid organic package substrate. In one embodiment, an IC is mounted on a flexible tape substrate using a ball grid array (BGA) arrangement. Other mounting arrangements, including lead bonding, can be used in conjunction with or in place of BGA mounting. The flexible tape can comprise one or more layers, conductive traces, and patterns of lands. Various embodiments are illustrated and described herein, including methods of fabrication, as well as application of the flexible tape package to an electronic assembly, an electronic system, and a data processing system.

Figure 1:
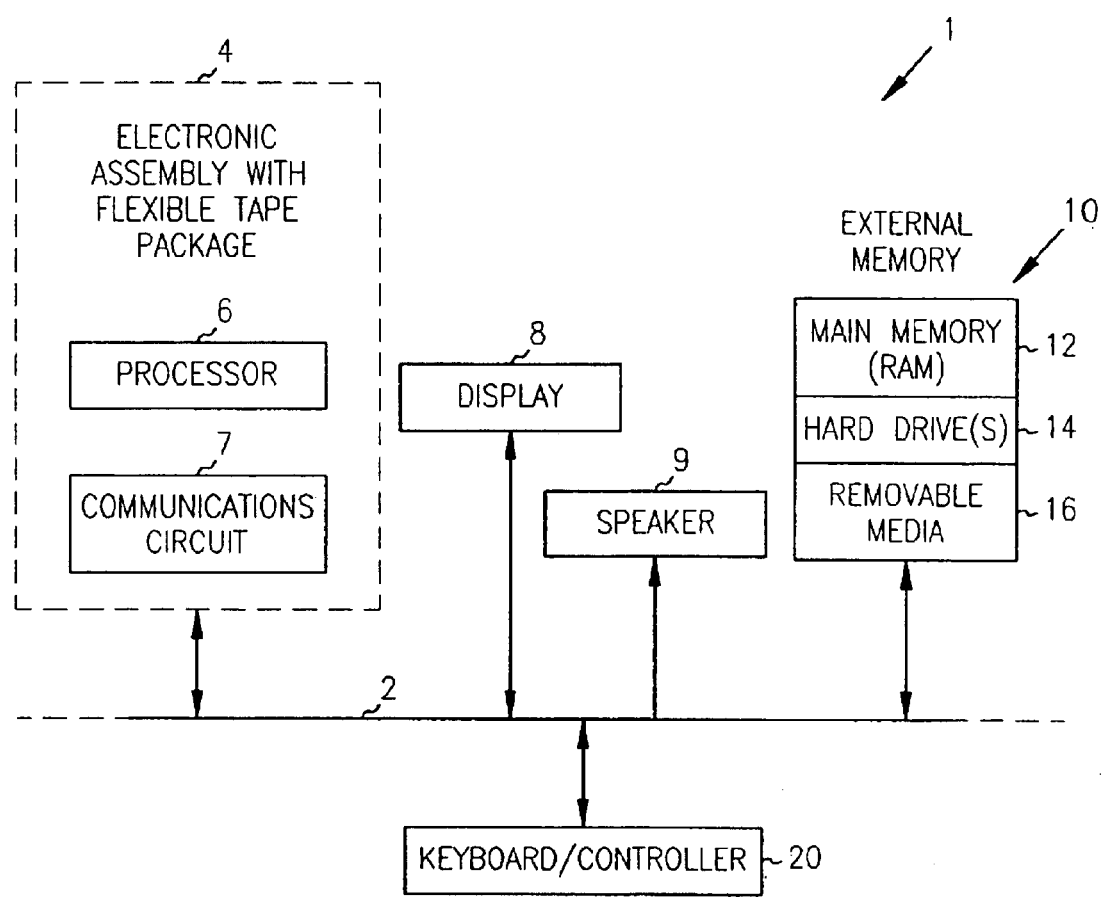
FIG. 1 is a block diagram of an electronic system incorporating at least one electronic assembly with a flexible tape package in accordance with one embodiment of the invention.

FIG. 1 is a block diagram of an electronic system 1 incorporating at least one electronic assembly 4 with a flexible tape package in accordance with one embodiment of the invention. Electronic assembly 4 has a reduced weight and a reduced thickness or stack height. Electronic assembly 4 can also possess a degree of flexibility, such that it can be bent or molded for particular applications.

Electronic system 1 is merely one example of an electronic system in which embodiments of the present invention can be used. In this example, electronic system 1 comprises a data processing system that includes a system bus 2 to couple the various components of the system. System bus 2 provides communications links among the various components of the electronic system 1 and can be implemented as a single bus, as a combination of busses, or in any other suitable manner.

Electronic assembly 4 is coupled to system bus 2. Electronic assembly 4 can include any circuit or combination of circuits. In one embodiment, electronic assembly 4 includes a processor 6 which can be of any type. As used herein, "processor" means any type of computational circuit such as, but not limited to, a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), or any other type of processor or processing circuit.

Other types of circuits that can be included in electronic assembly 4 are a custom circuit, an application-specific integrated circuit (ASIC), or the like, such as, for example, one or more circuits (such as a communications circuit 7) for use in wireless devices like cellular telephones, pagers, portable computers, two-way radios, and similar electronic systems. Electronic assembly 4 can perform any other type of function.

Electronic system 1 can also include an external memory 10, which in turn can include one or more memory elements suitable to the particular application, such as a main memory 12 in the form of random access memory (RAM), one or more hard drives 14, and/or one or more drives that handle removable media 16 such as floppy diskettes, compact disks (CDs), digital video disk (DVD), and the like.

Electronic system 1 can also include a display device 8, a speaker 9, and a keyboard and/or controller 20, which can include a mouse, trackball, game controller, microphone, voice-recognition device, or any other device that permits a system user to input information into and receive information from the electronic system 1.

Among various embodiments, system 1 could be a hearing aid, a pacemaker, a wristwatch, a pager, a cellular phone, an Internet appliance, a personal digital assistant (PDA), or a palmtop computer. However, many other different embodiments can also take advantage of the relatively low stack height, relatively low weight, and relatively high degree of flexibility of electronic packaging provided by embodiments of the present invention.

Figure 2:
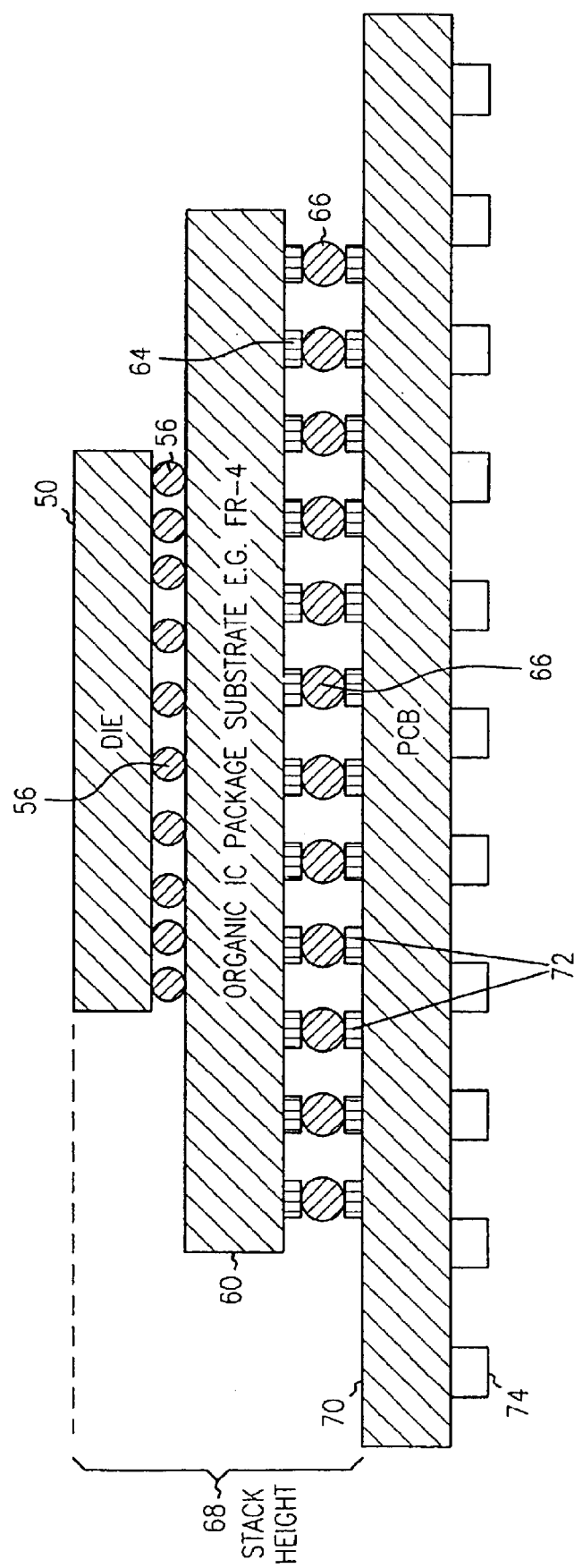
FIG. 2 illustrates a cross-sectional representation of a prior art electronic assembly comprising an IC package mounted on a printed circuit board (PCB)

FIG. 2 illustrates a cross-sectional representation of a prior art electronic assembly comprising an IC package mounted on a printed circuit board (PCB). The prior art electronic package includes die 50 having a plurality of signal and power supply lands (not shown) on its lower surface.

The package also includes substrate 60, e.g. an IC package substrate, having a plurality of signal and power supply lands (not shown) on its upper surface that are coupled to corresponding lands of die 50 through bumps or balls 56. IC package substrate 60 is typically formed of an organic material. FR-4 is one type of organic material that is widely used. IC package substrate 60 comprises a plurality of signal and power supply lands 64 on its lower surface. Lands 64 of IC package substrate 60 are coupled to corresponding lands 72 of a secondary substrate, such as printed circuit board PCB 70, through solder balls or bumps 66. PCB 70 can optionally have lands 74 on its lower surface for attachment to an additional substrate or other packaging structure in the packaging hierarchy.

Regarding the prior art electronic assembly of FIG. 2, the "stack height" 68 is the distance between the upper surface of die 50 and the upper surface of PCB 70. It is desirable to minimize the stack height 68 in order to provide an electronic assembly having minimum thickness and minimal loop inductance. It will be understood that the stack height of a prior art electronic assembly that utilizes a socket arrangement would typically be even greater than the BGA assembly illustrated in FIG. 2.

Figure 3:
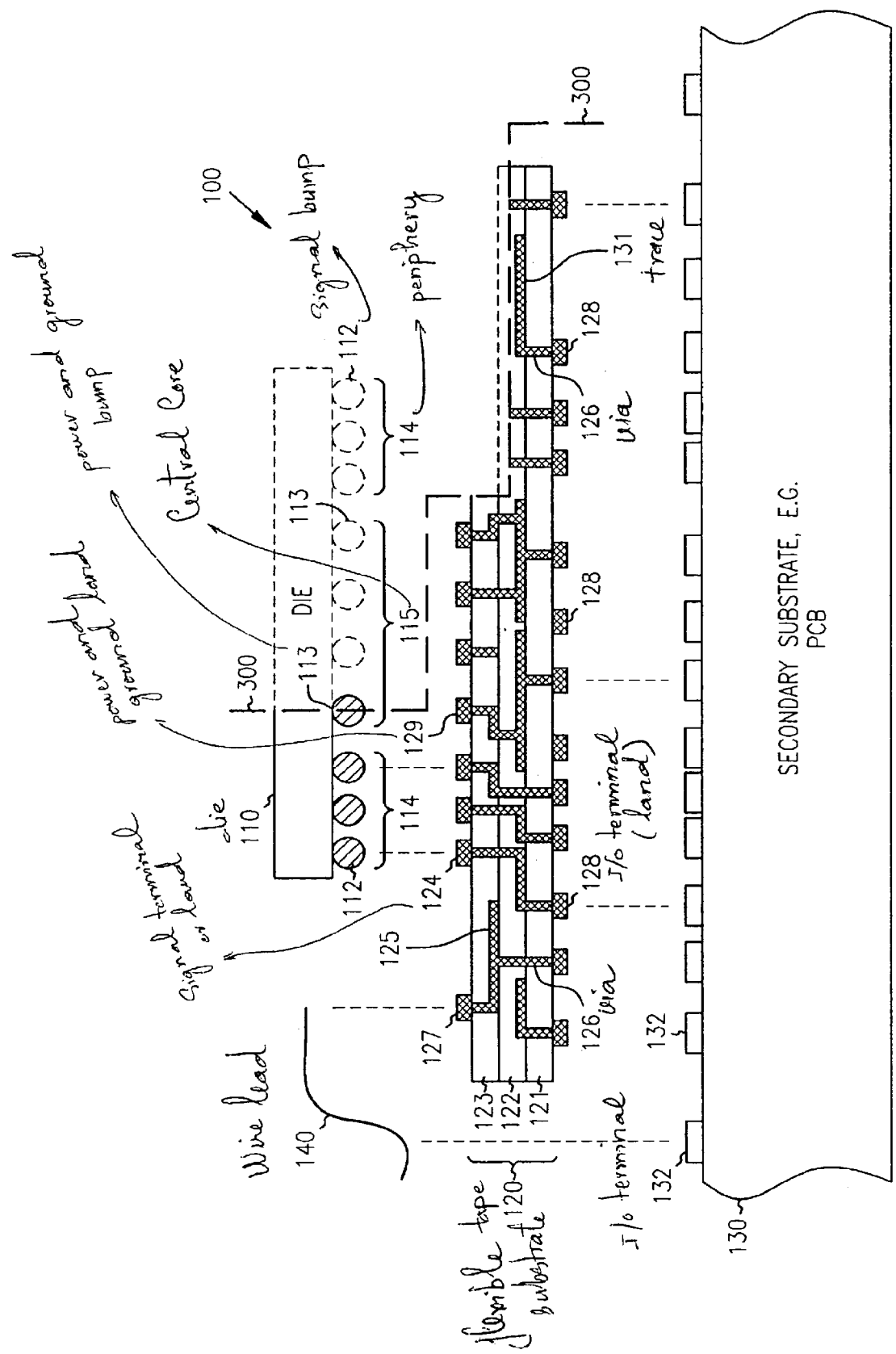
FIG. 3 illustrates a partially exploded cross-sectional representation of a flexible tape package assembly, taken along dashed line 400 of FIG. 4, including a die aligned for mounting to a flexible tape substrate overlying a secondary substrate, such as a PCB, in accordance with one embodiment of the invention.
Figure 4:
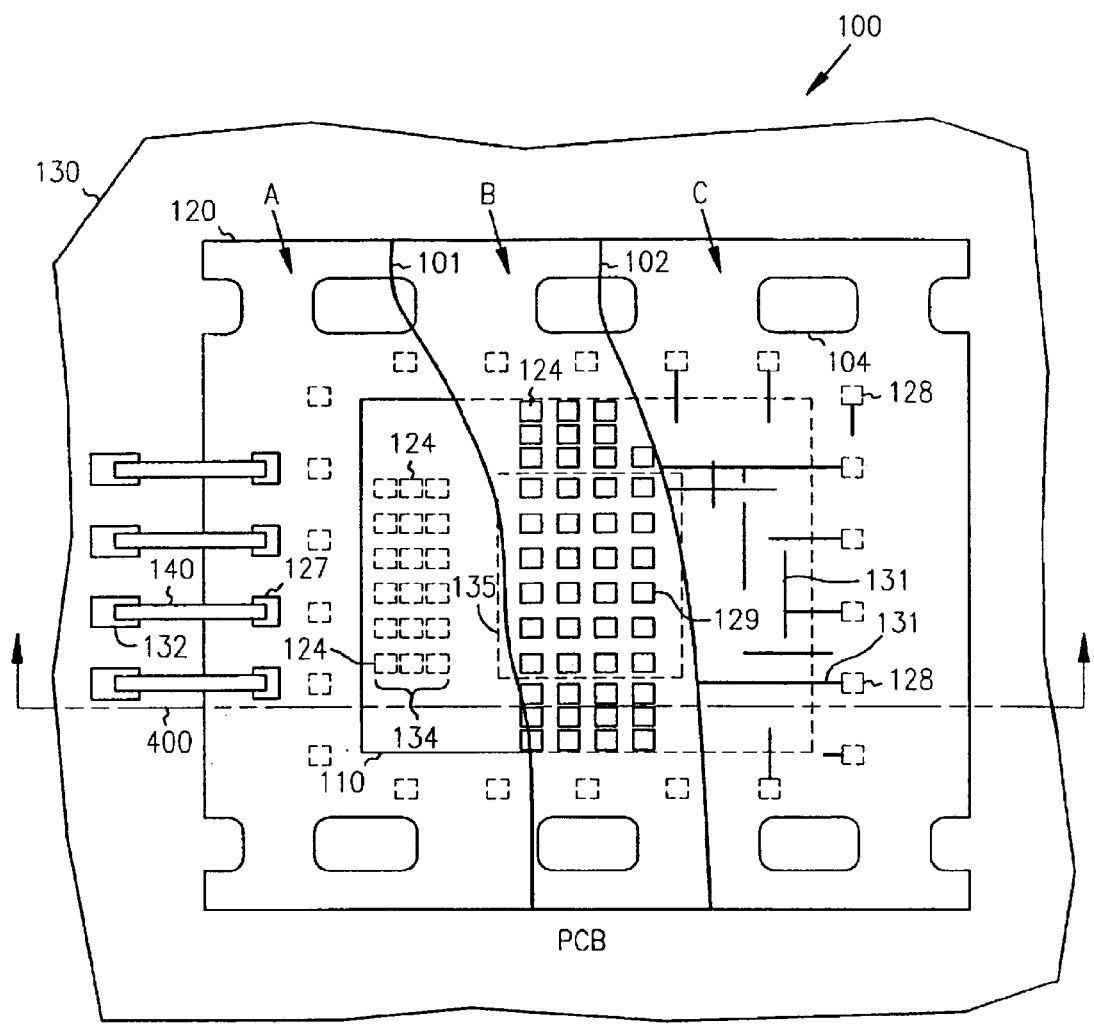
FIG. 4 illustrates a top-view of the flexible tape package assembly shown in FIG. 3, with cut-away portions corresponding to dashed line 300 of FIG. 3.

FIG. 3 illustrates a partially exploded cross-sectional representation of a flexible tape package assembly 100, taken along dashed line 400 of FIG. 4, including a die 110 aligned for mounting to a flexible tape substrate 120 overlying a secondary substrate 130, such as a PCB, in accordance with one embodiment of the invention.

Die 110 can be any type of IC, such as a processor, memory chip, chipset component, or the like.

In FIG. 3, die 110 comprises a plurality of electronic circuits and signal conductors (not shown) that terminate in lands (not shown) arranged in several rows near the periphery 114 of the bottom surface of die 110 (as viewed in FIG. 3, with die 110 in a flip-chip orientation). Die 110 also comprises a plurality of power and ground conductors (not shown) that terminate in lands (not shown) within the central core region 115 of die 110. The signal and power lands on the lower surface of die 110 can be coupled to corresponding lands, pads, or signal nodes (not shown) on substrate 120 by appropriate connections such as solder bumps or solder balls 112 and 113, respectively. That is, viewing both FIGS. 3 and 4 (to be discussed below), signal lands around the periphery 114 of the bottom surface of die 110 can be coupled to corresponding signal lands 124 around the periphery 134 of a "conductor region" (as such term is defined further below) on the upper surface of substrate 120, and power and ground lands within the central core region 115 of the bottom surface of die 110 can be coupled to corresponding power and ground lands 129 within the central core region 135 of the "conductor region" on the upper surface of substrate 120.

Flexible substrate 120, in the embodiment shown in FIG. 3, comprises three layers 121–123. In an embodiment, layers 121–123 are contiguous, i.e. physically touching. Substrate 120, including layers 121–123, can be formed of a thin, flexible, electrically insulating tape or film. Such films are well known in the tape automated bonding (TAB) art. Such films can be formed of various materials. For example, they can be formed of polymeric films, such as polyimide. Other possible materials include polyester, polyparabanic acid, epoxy, and fiberglass.

In one embodiment, each layer of flexible substrate 120 has a thickness of approximately 0.20 mm, and the overall thickness of flexible substrate 120, comprising three layers 121–123, is approximately 0.60 mm. However, in other embodiments, thicker or thinner film could be used. In general, each layer of film can be in the range of approximately 0.15 mm to 0.30 mm.

Upper layer 123 has formed directly on its upper surface a plurality of signal terminals or lands 124 and power and ground lands 129 to couple with corresponding pads of IC 110 through signal bumps 112 and power and ground bumps 113, respectively. Other lands 127 can also be formed on the upper surface of upper layer 123. Lands 127 can be used to couple to corresponding terminals 132 on the upper surface of PCB 130 through wire leads such as lead 140.

Between upper layer 123 and middle layer 122 are formed a plurality of conductive traces, such as trace 125. Likewise, between middle layer 122 and bottom layer 121 are formed a plurality of conductive traces, such as trace 131. Traces can be formed using any suitable conductive material, such as copper, aluminum, silver, or the like.

Bottom layer 121 has formed on its lower surface a plurality of lands such as lands 128.

Conductive vias, such as vias 126, can be formed in any layer 121–123, through a subset of layers 121–123, or through all three layers 121–123, to couple traces within different layers 126, or to couple lands such as 124, 127, 128, and 129 to internal traces such as traces 125 and 131.

While three layers 121–123 are illustrated in the embodiment shown in FIG. 3, fewer or more layers could be used. For example, just one layer could be used. Further, not all layers need to be electrically insulating, because one or more ground planes could be inserted that are formed of any suitable electrically conductive material.

Substrate 120 can be mounted on a secondary substrate such as PCB 130 by coupling lands 128 of substrate 120 to corresponding terminals 132 on the upper surface of PCB 130. In one embodiment, lands 128 are coupled to terminals 132 via a ball grid array (BGA) of solder balls (not shown in FIG. 3).

In another embodiment, lands on the upper surface of substrate 120, such as land 127, can be coupled to corresponding lands 132 on the upper surface of PCB 130 through conductive leads or wires, such as lead 140. In yet another embodiment, a combination of BGA and wire lead attachments can be used.

Substrate 130 can be of any type, such as a printed circuit board (PCB) or card, a motherboard, or any other type of packaging element. Substrate 130 can be a multi-layered substrate or a single-layered substrate. Embodiments of the present invention are not to be construed as limited to any particular type of substrate 130 or to any particular method of coupling substrate 120 to substrate 130. Substrate 130 can optionally have lands (not shown) on its lower surface for attachment to an additional substrate or other packaging structure.

The resulting stack height of flexible tape package assembly 100 is significantly less than that of the prior art electronic assembly illustrated in FIG. 2. For example, if a flexible tape substrate 120 having a thickness of 0.6 mm is used in the embodiment shown in FIG. 3, the resulting overall stack height is approximately 20% less than the stack height of the prior art electronic assembly illustrated in FIG. 2, assuming the thicknesses of the die and die bumps, and the interconnect between the package and the PCB are held constant. Even thinner assemblies can be achieved by using fewer layers within flexible tape package assembly 100.

FIG. 4 illustrates a top-view of the flexible tape package assembly 100 shown in FIG. 3, with cut-away portions corresponding to dashed line 300 of FIG. 3. A first cut-away portion A is to the left of line 101. A second cut-away portion B is between lines 101 and 102. And a third cut-away portion C is to the right of line 102.

The top-view of flexible tape package assembly 100 shown in portion A includes the top of IC 110 as mounted upon flexible tape package substrate 120 by way of, for example, a surface mount technique, such as a BGA pattern that can include signal lands 124 (shown in dashed lines in portion A, since they are underneath IC 110). Signal lands 124 are located around the periphery 134 of the "conductor region" (as defined below).

Substrate 120, in turn, can be mounted to a secondary substrate, such as PCB 130, in at least two different ways, both of which are illustrated in portion A, or in a combination of these two ways. A first way is using a BGA pattern that can include lands on the bottom surface of substrate 120, such as lands 128 (shown in dashed lines in portions A–C, since they are underneath substrate 120), that are coupled to corresponding terminals on the upper surface of PCB 130 (such as terminals 132 shown in FIG. 3). Another way is using conductive leads or wires, such as lead 140, which couples a land 127 on the upper surface of flexible tape package substrate 120 to a corresponding terminal 132 on the upper surface of PCB 130.

The top-view of flexible tape package assembly 100 shown in portion B includes the top of flexible tape package substrate 120, showing a BGA pattern on its upper surface, which includes power and ground lands 129. Power and ground lands 129 are located within a central core region 135 of the "conductor region" (as defined below).

The top-view of flexible tape package assembly 100 shown in portion C is of the top of layer 121, showing a plurality of conductive traces 131 on the upper surface of layer 121. Also shown (in dashed outline) are lands 128 on the bottom surface of substrate 120. Lands 128 can be coupled to traces 131 using vias such as vias 126.

Flexible tape package substrate 120 has a "conductor region" that is adapted to have mounted thereon an IC, such as IC 110. As used herein, a "conductor region" means a region that can contain vias, traces, and/or lands anywhere within the boundary of the region, as defined for example by dashed outline 519 of FIG. 5 (to be described below). A "conductor region" is typically substantially square or rectangular, though it need not be limited to such shapes. A "conductor region" is distinguishable from a tape automated bonding (TAB) lead-frame conductive pattern, which has conductive leads and pads that are located at the periphery of the pattern, surrounding an IC, but which does not have traces, vias, or lands beneath the IC.

Flexible tape package substrate 120 can include sprockets 104 that are outside the conductor region. Sprockets 104 can be used in conjunction with a suitable transport mechanism (not shown) to facilitate production movement within a high volume manufacturing environment, at least until the flexible tape is separated or "singulated" into individual IC-mounted tape segments.

FIGS. 5–10 together illustrate different stages in a process of fabricating a flexible tape package assembly, in accordance with one embodiment of the invention.

Figure 5:
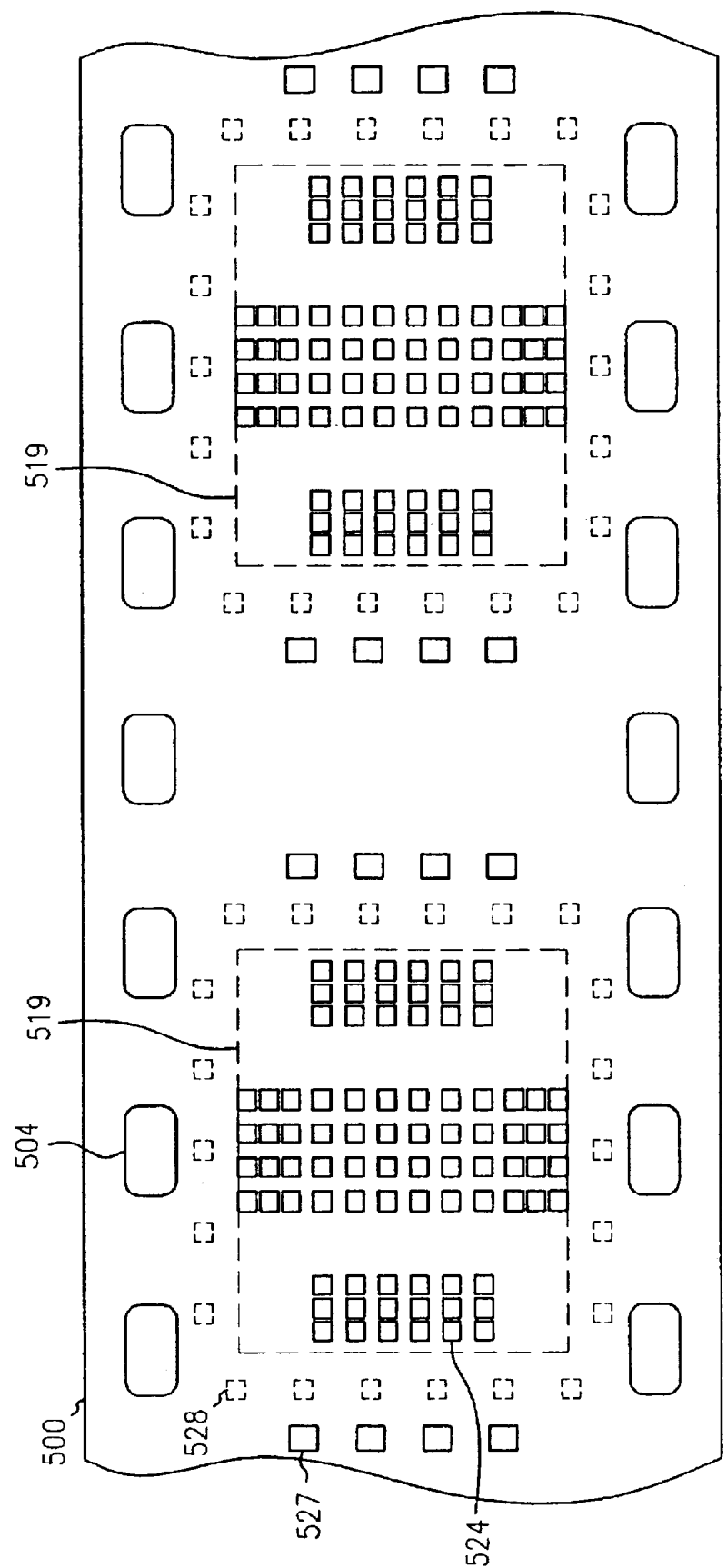

FIG. 5 illustrates a top view of a flexible tape substrate 500 having a pattern of lands 524, 527, and 528 thereon. In the embodiment shown in FIG. 5, flexible tape substrate 500 has been formed, and it comprises several layers. Dashed outlines 519 show locations where ICs will subsequently be mounted. Within each dashed outline 519 appears an illustrative pattern of lands, such as land 524, which will be coupled to corresponding pads on the bottom of an IC. In one embodiment, the pattern is a BGA.

Also seen in FIG. 5 are lands 528 (shown in dashed outline) on the bottom surface of flexible tape substrate 500, which will be used to mount flexible tape substrate 500 to a secondary substrate, such as a PCB. In addition, lands 527 are seen on the upper surface of flexible tape substrate 500, and they can be coupled to corresponding lands on the PCB using wire leads if desired. Sprockets 504 can be provided to enable transport of the flexible tape substrate 500 through a high volume manufacturing area.

Figure 6:
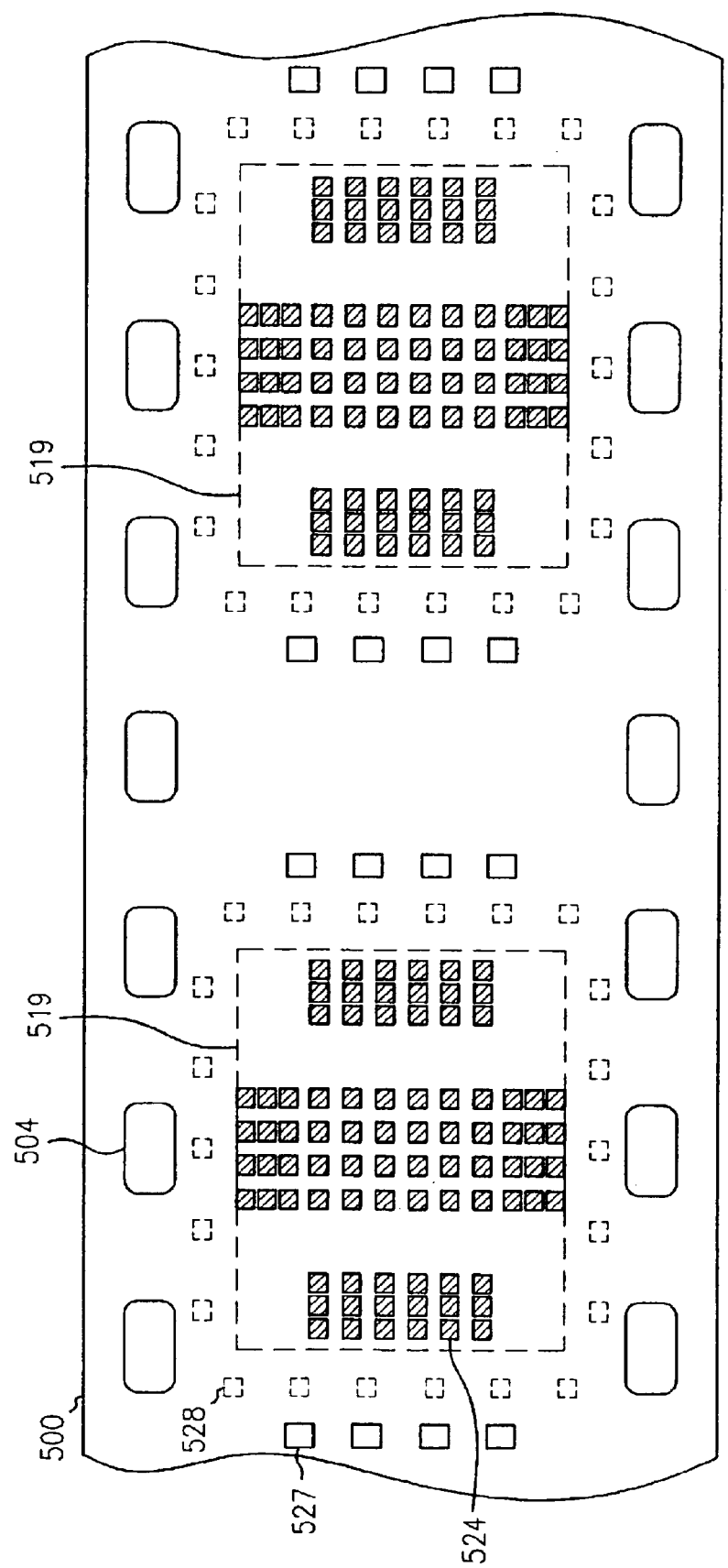

FIG. 6 illustrates a top view of a flexible tape substrate 500 having solder paste applied to lands 524 on a surface thereof. Prior to mounting ICs on flexible tape substrate 500, solder paste can be applied to all exposed lands on flexible tape substrate 500, or alternatively just to lands 524 (as indicated by cross-hatching) to which the ICs will be mounted. The ICs can have a bump or ball pattern already applied. Alternatively, a ball pattern could be applied to lands 524 of flexible tape substrate 500.

Figure 7:
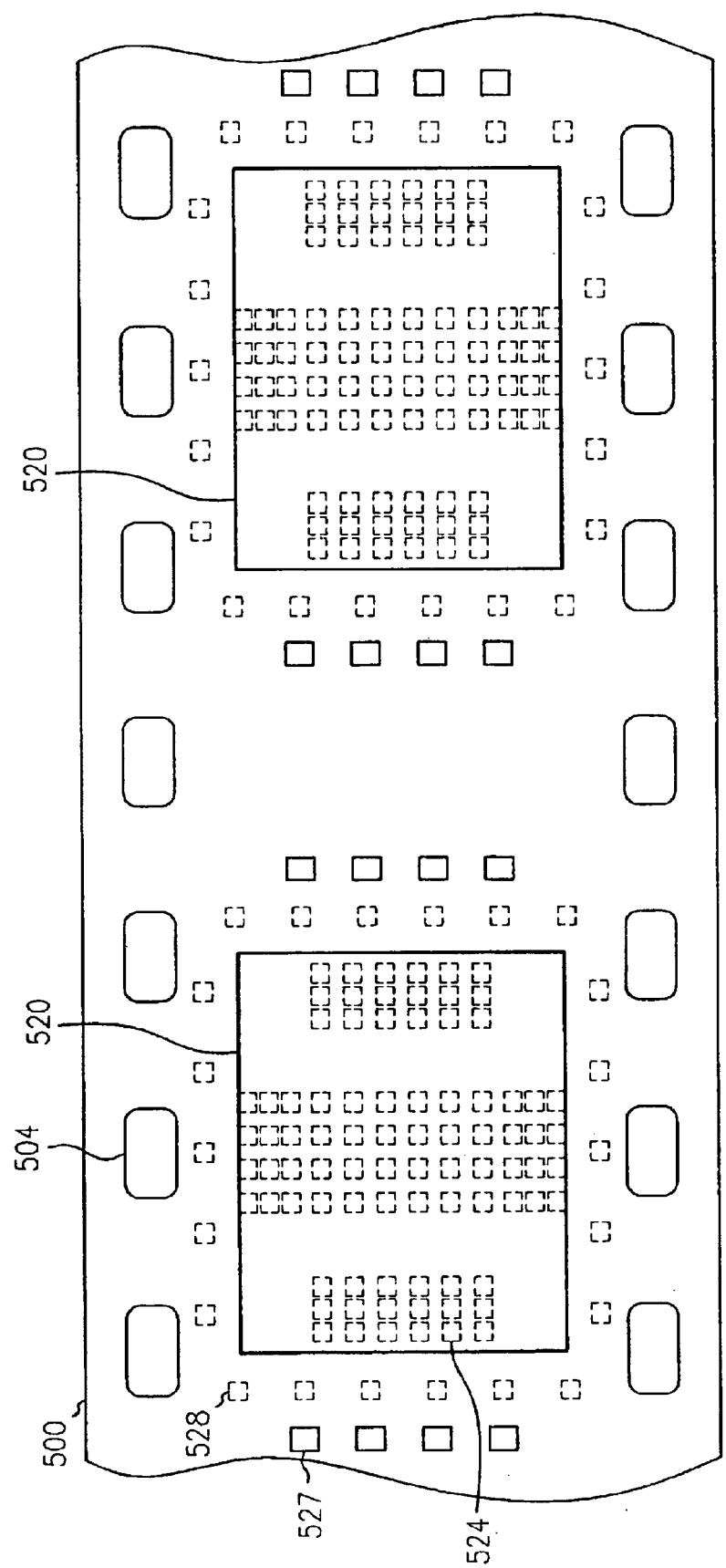

FIG. 7 illustrates a top view of a flexible tape substrate 500 with dice 520 mounted on a surface thereof. Dice 520 can be mounted using a BGA arrangement in which solder bumps or balls on the lower surfaces of dice 520 are coupled using, for example, a solder reflow process, to corresponding lands 524 (shown in dashed outline) on the upper surface of flexible tape substrate 500.

Figure 8:
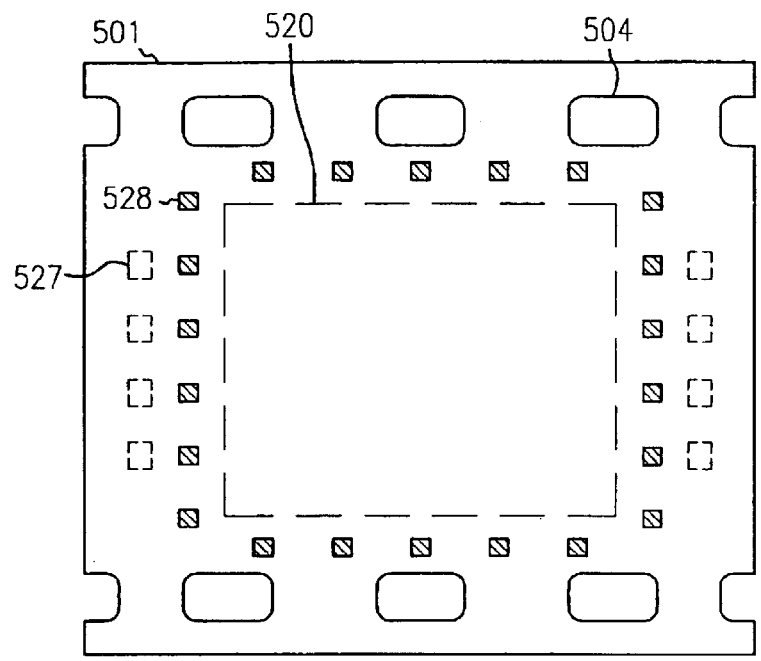

FIG. 8 illustrates a bottom view of a segment of flexible tape IC package 501 having solder balls on a surface thereof. Seen in dashed outline 520 is an IC mounted on the upper surface of flexible tape IC package 501. Prior to this stage in the process, flexible tape substrate 500 has been segmented or "singulated" into individual tape segments. After singulation, the individual flexible tape substrate segments, referred to hereinafter as flexible tape IC packages 501, are typically placed into transport carriers or trays for subsequent testing and possibly other manufacturing and shipping operations. Next, solder balls are formed on corresponding lands 528.

Figure 9:
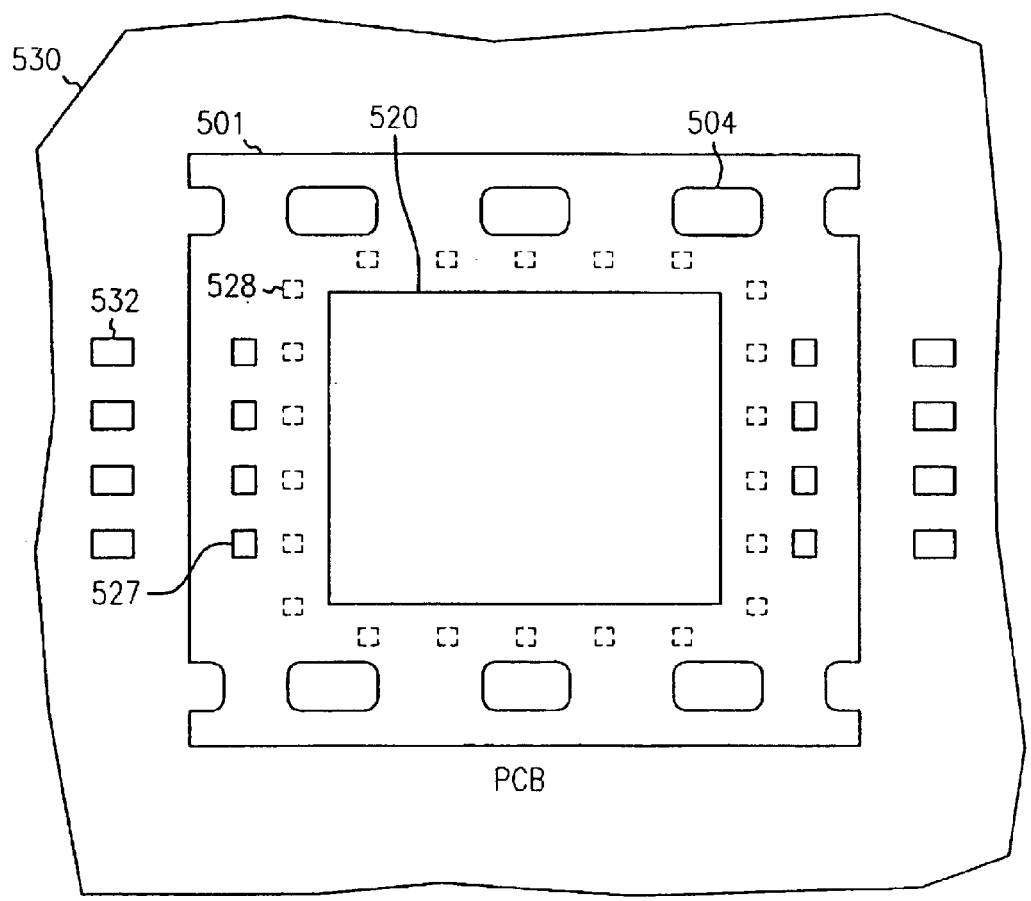

FIG. 9 illustrates a top view of a portion of a secondary substrate 530, such as a PCB, having a flexible tape IC package 501 mounted thereon. Flexible tape IC package 501 includes IC 520. Also shown is a pattern of lands 528 (in dashed outline) on the bottom of flexible tape IC package 501, which pattern can be a BGA. In FIG. 9, flexible tape IC package 501 has been aligned with PCB 530, and lands 528 have been coupled to corresponding terminals (not shown) on PCB 530, e.g. using a solder reflow process.

Figure 10:
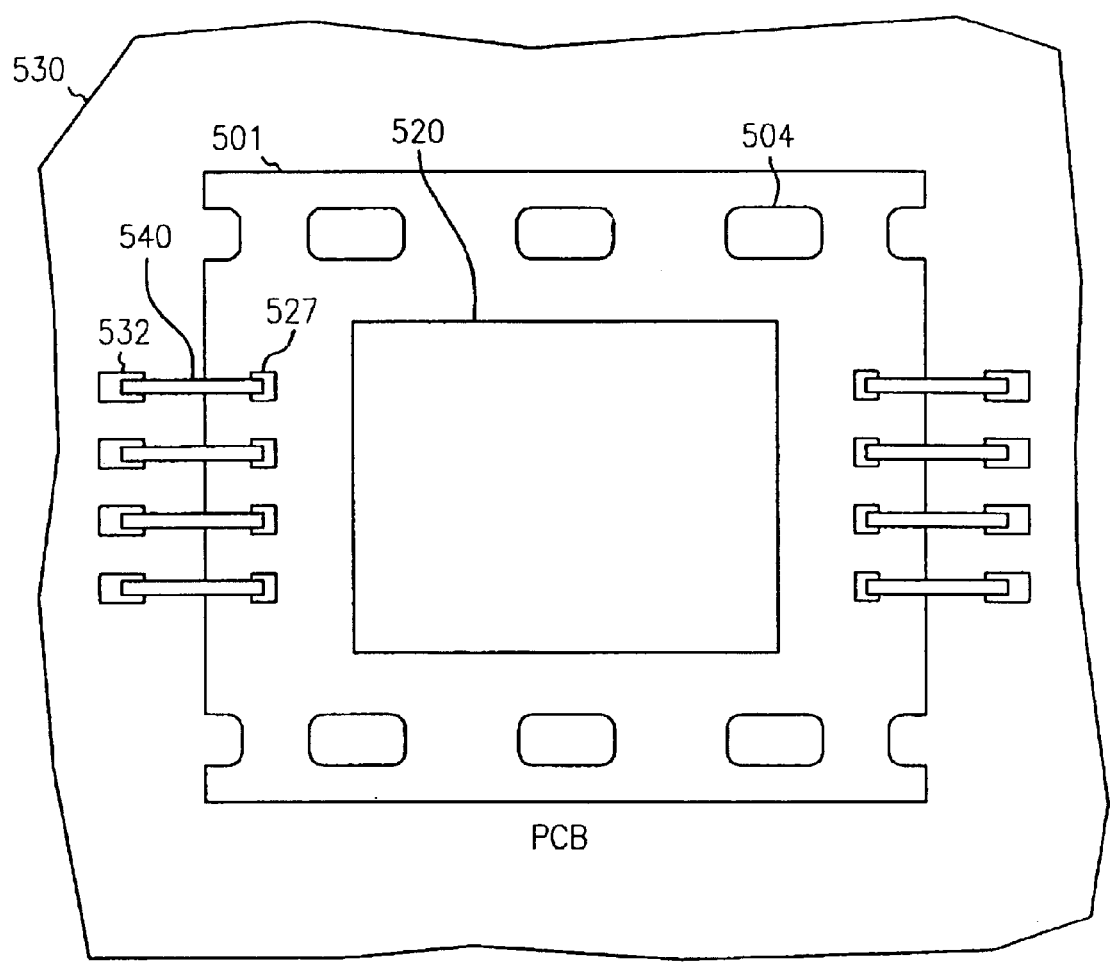

FIG. 10 illustrates a top view of a portion of the secondary substrate 530 and flexible tape IC package 501 of FIG. 9, with leads 540 mounted. As mentioned earlier, flexible tape IC package 501 can be mounted using solely a BGA pattern, using solely lead bonding, or using a combination of BGA and lead bonding. If lead bonding is used, leads 540 are coupled between lands 527 on the upper surface of flexible tape IC package 501 and corresponding terminals 532 on the upper surface of PCB 530.

Figure 11:
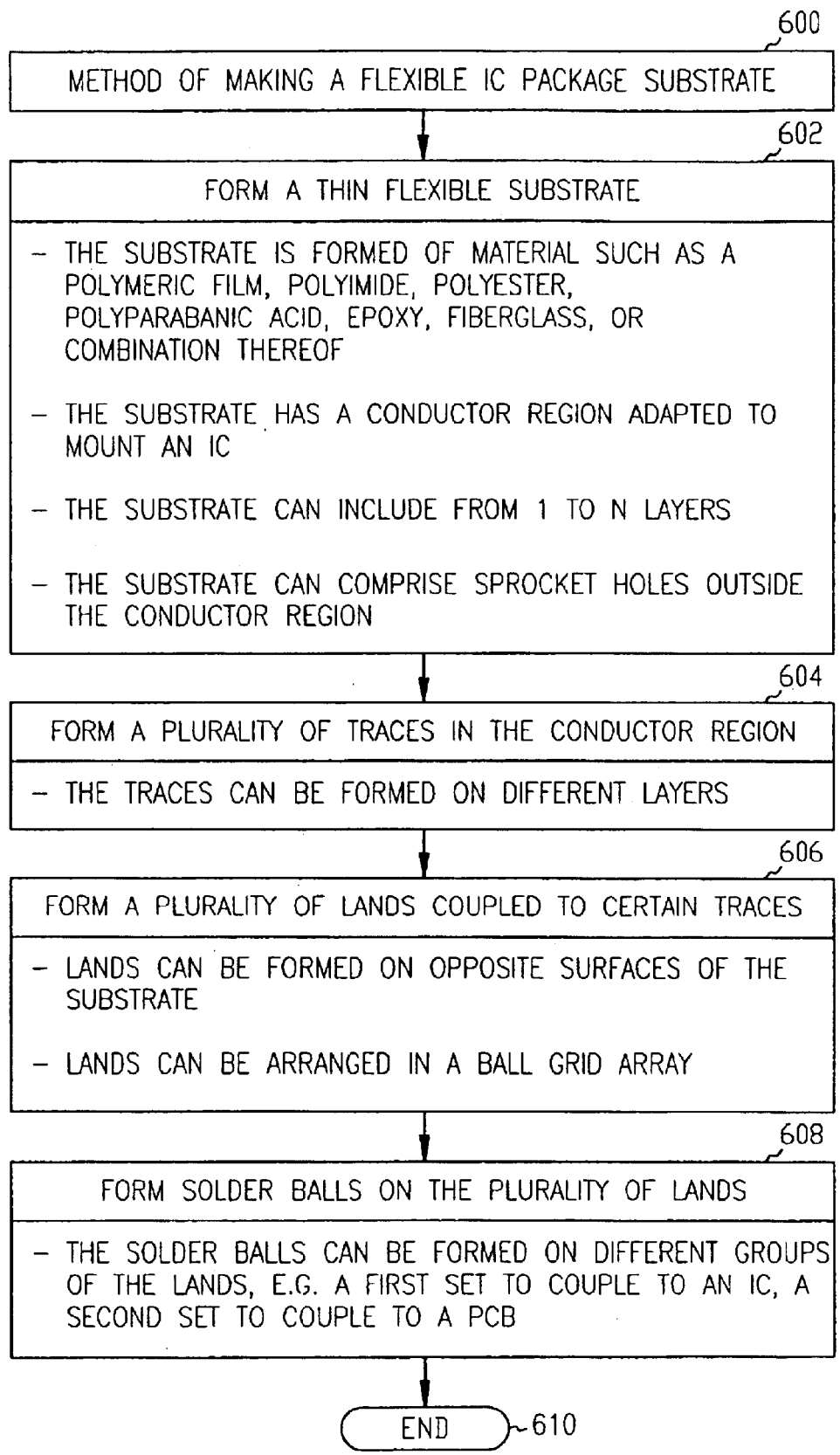
FIG. 11 is a flow diagram illustrating a method of fabricating a flexible IC package substrate, in accordance with one or more embodiments of the invention.

FIG. 11 is a flow diagram illustrating a method 600 of fabricating a flexible IC package substrate, in accordance with one or more embodiments of the invention.

In 602, a thin, flexible substrate is provided. The substrate is formed of material such as a polymeric film, polyimide, polyester, polyparabanic acid, epoxy, fiberglass, or a combination of these materials. The substrate has a "conductor region" (as defined earlier) adapted to mount an IC. The substrate can include from 1 to N layers. The substrate can also include, if desired, sprocket holes located outside the "conductor region".

In 604, a plurality of traces are formed in the conductor region. The traces can be formed on different layers, or they can be formed on one layer.

In 606, a plurality of lands are formed that are coupled to certain traces of the plurality of traces. The lands can be formed on opposite sides of the substrate, or on just one side of the substrate. In one embodiment, the lands are arranged in one or more ball grid arrays (BGAs).

In 608, solder bumps or balls are formed on the plurality of lands. The solder balls can be formed on different groups of the lands. For example, a first set of lands can be covered with solder balls in order to couple the substrate to an IC, and a second set of lands can be covered with solder balls in order to couple the substrate (including IC) to a PCB. The process ends at 610.

Figure 12A:
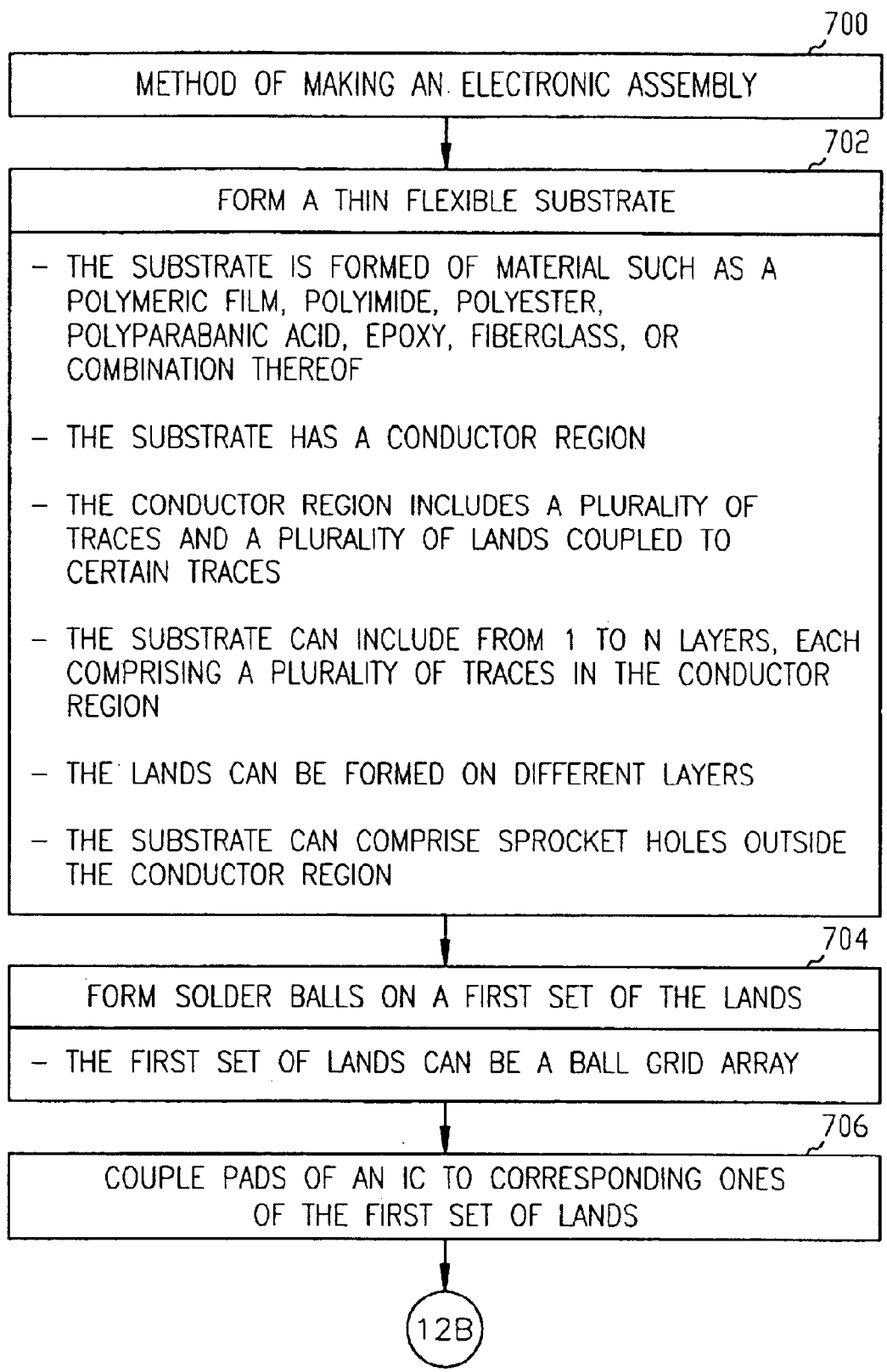
FIGS. 12A and 12B together form a flow diagram illustrating a method of fabricating an electronic assembly, in accordance with one or more embodiments of the invention.
Figure 12B:
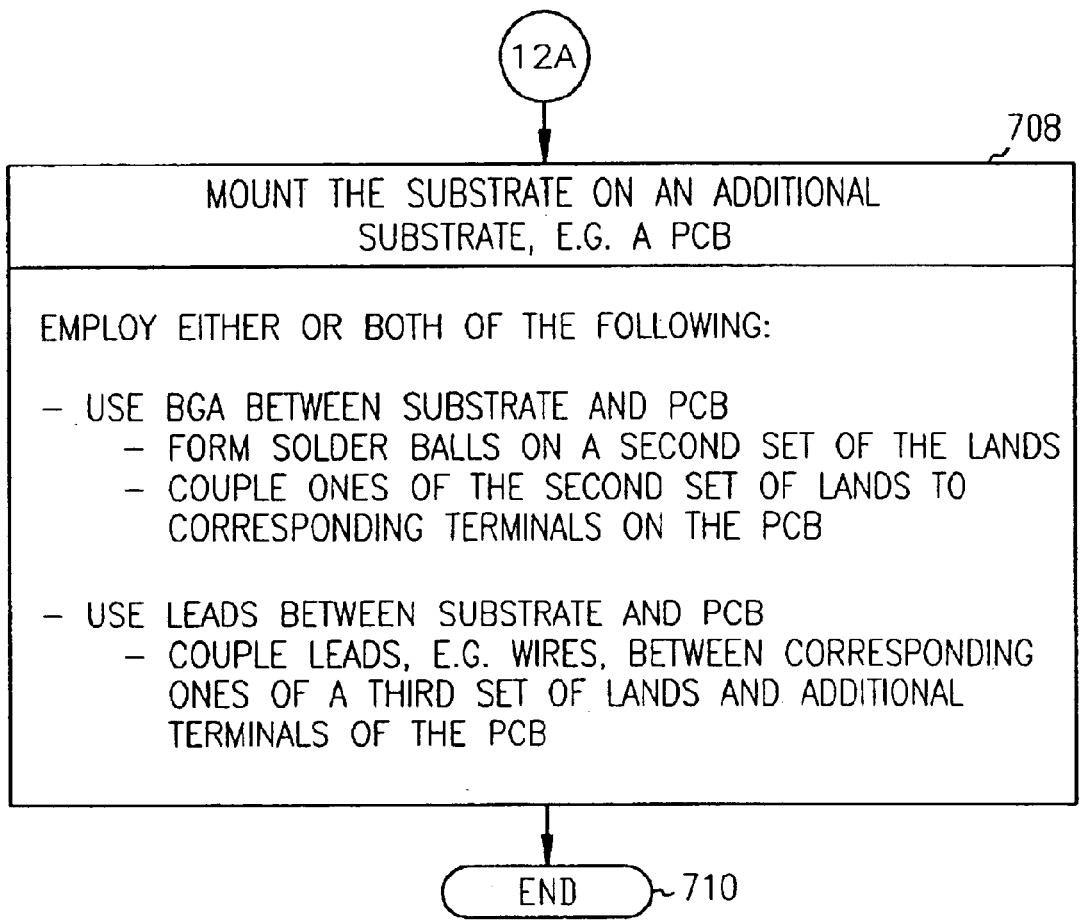
Figure 3:
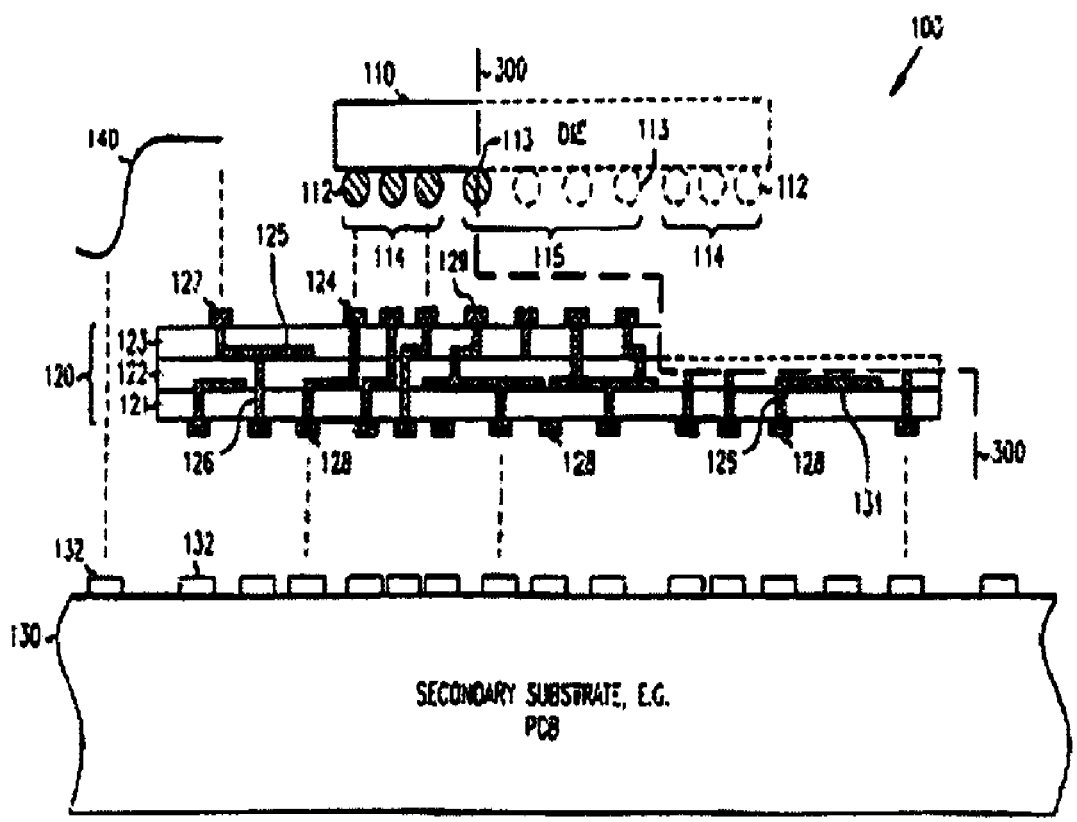

FIGS. 12A and 12B together form a flow diagram illustrating a method 700 of fabricating an electronic assembly, in accordance with one or more embodiments of the invention.

In 702, a thin, flexible substrate is provided. The substrate is formed of material such as a polymeric film, polyimide, polyester, polyparabanic acid, epoxy, fiberglass, or a combination of these materials. The substrate has a "conductor region" (as defined earlier) that includes a plurality of traces and a plurality of lands coupled to certain traces. The substrate can include from 1 to N layers, each comprising a plurality of traces in the "conductor region". The lands can be formed on different layers. The substrate can also include, if desired, sprocket holes located outside the "conductor region".

In 704, solder balls are formed on a first set of lands, which can be a ball grid array (BGA).

In 706, pads of an IC are coupled to corresponding ones of the first set of lands using, for example, a solder reflow operation.

In 708, the substrate is mounted on an additional substrate, such as a PCB. Either or both of the following techniques can be used: (1) use a BGA pattern between the substrate and the PCB, by forming solder balls on a second set of the lands, and coupling ones of the second set of lands to corresponding terminals on the PCB; (2) use leads between the substrate and the PCB, by coupling leads, such as wires, between corresponding ones of a third set of lands and additional terminals of the PCB. The process ends in 710.

The operations described above with respect to the methods illustrated in FIGS. 11, 12A, and 12B can be performed in a different order from those described herein. Also, it will be understood that while an "end" block is shown in FIGS. 11 and 12B, these methods can be performed continuously.

CONCLUSION

Embodiments of the present invention provide for a lightweight electronic package, in several different embodiments, and for methods of manufacture thereof, that minimize the thickness of the package, and that offer some degree of flexibility and/or of moldability. Loop inductance within the package is also reduced, because conductive paths through the flexible tape substrate are shorter than they are through an organic substrate.

An electronic system and/or data processing system that incorporates one or more electronic assemblies that utilize the present disclosure can be produced in configurations having reduced thickness and weight, and with enhanced flexibility and electronic performance, and such systems are therefore more commercially attractive.

As shown herein, the present disclosure can be implemented in a number of different embodiments, including an electronic package substrate, an electronic package, an electronic system, a data processing system, one or more methods of fabricating a flexible tape package, and one or more methods of fabricating a flexible tape package assembly. Other embodiments will be readily apparent to those of ordinary skill in the art. The elements, materials, geometries; dimensions, and sequence of operations can all be varied to suit particular packaging requirements.

For example, while an embodiment of an IC is shown in which signal traces are provided around the periphery and in which power supply traces are provided at the die core, the disclosure is equally applicable to embodiments where signal traces and power supply traces are provided anywhere on the die.

Further, embodiments of the present invention are not to be construed as limited to use in ball grid array (BGA) packages, and they can be used with any other type of IC packaging technology where the herein-described features of the present disclosure provide an advantage, e.g. land grid array (LGA), chip scale package (CSP), or the like.

Various embodiments of flexible tape substrates can be implemented. The structure, including types of materials used, dimensions, layout, electrical properties, and so forth, of flexible tape substrates can be built in a wide variety of embodiments, depending upon the requirements of the IC package and/or electronic assembly of which the flexible tape substrate forms a part.

While an embodiment has been described in which the electronic component that is mounted on flexible tape substrate is an IC, the electronic component could also be a passive component such as a resistor, capacitor, or inductor, or any other type of electronic component, whether or not implemented as an IC, such as an oscillator, filter, sensor, variable resistor, fuse, coil, or the like.

The above-described choice of materials, geometry, and assembly operations can all be varied by one of ordinary skill in the art to optimize the performance of the electronic package.

FIGS. 1 through 10 are merely representational and are not drawn to scale. Certain proportions thereof may be exaggerated, while others may be minimized. FIGS. 1 and 3–12B are intended to illustrate various implementations of the invention embodiments that can be understood and appropriately carried out by those of ordinary skill in the art.

Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of embodiments of the present invention. Therefore, it is manifestly intended that the invention embodiments be limited only by the claims and the equivalents thereof.

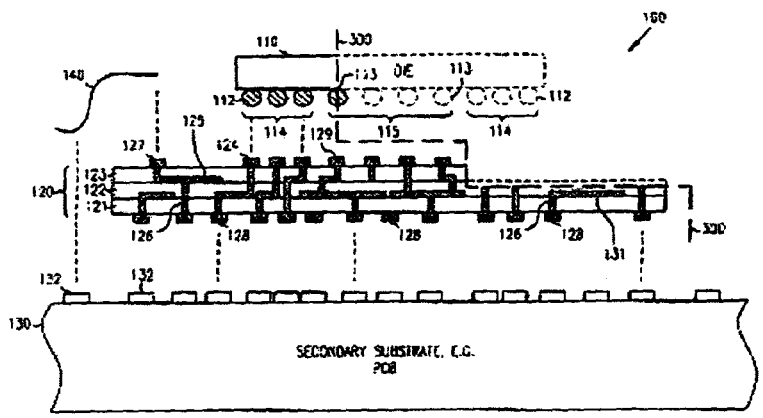

What is claimed is:

1. An electronic package comprising:
    a package substrate including
        a thin, flexible, electrically insulating film including a conductor region to mount an integrated circuit;
        a plurality of traces, at least some of which are within the conductor region;
        one or more vias within the film and coupled to corresponding ones of the traces; and
        a plurality of lands on a surface of the film and coupled to the traces, the plurality of lands including a plurality of signal lands around the periphery of the conductor region, the plurality of lands further including a plurality of power and ground lands within a central core region of the conductor region; and
    an integrated circuit including a plurality of pads coupled to the plurality of lands in a ball grid array.

2. The electronic package recited in claim 1, wherein the film is formed of material selected from the group consisting of a polymeric film, polyimide, polyester, polyparabanic acid, epoxy, and fiberglass.

3. The electronic package recited in claim 1, wherein the film comprises a plurality of layers, each of the layers comprising a plurality of traces in the conductor region, and wherein each layer has a thickness within the range of approximately 0.15 to 0.30 millimeters.

4. The electronic package recited in claim 1, wherein the film comprises a plurality of contiguous layers, selected ones of which layers comprise selected ones of the plurality of traces, and wherein selected ones of the one or more vias couple traces within selected layers.

5. An electronic system including at least one electronic assembly comprising:
    a thin, flexible, electrically insulating film including a conductor region, a plurality of traces in the conductor region, and a plurality of lands formed directly upon a surface of the film and coupled to the traces, the plurality of lands including a plurality of signal lands around the periphery of the conductor region, the plurality of lands further including a plurality of power and ground lands within a central core region of the conductor region;
    an integrated circuit including a plurality of pads coupled to the plurality of lands in a ball grid array; and
    wherein the film comprises a plurality of contiguous layers, selected ones of which comprise a plurality of traces in the conductor region, and wherein the film comprises one or more vias coupled to corresponding ones of the traces.

6. The electronic system recited in claim 5, wherein the film is formed of material selected from the group consisting of a polymeric film, polyimide, polyester, polyparabanic acid, epoxy, and fiberglass.

7. The electronic system recited in claim 5, wherein the one or more vias couple traces within selected layers.

8. A data processing system comprising:
- a bus coupling components in the data processing system;
- a display coupled to the bus;
- a memory coupled to the bus; and
- a processor coupled to the bus and comprising an electronic assembly including,
  - a thin, flexible, electrically insulating film including a conductor region, a plurality of traces in the conductor region, one or more vias coupled to corresponding ones of the traces, and a plurality of lands formed directly upon a surface of the film and coupled to the traces, the plurality of lands including a plurality of signal lands around the periphery of the conductor region, the plurality of lands further including a plurality of power and ground lands within a central core region of the conductor region; and
  - an integrated circuit including a plurality of pads coupled to the plurality of lands in a ball grid array.

9. The data processing system recited in claim 8, wherein the film is formed of material selected from the group consisting of a polymeric film, polyimide, polyester, polyparabanic acid, epoxy, and fiberglass.

10. The data processing system recited in claim 8, wherein the film comprises a plurality of layers, each of the layers comprising a plurality of traces in the conductor region.

11. The data processing system recited in claim 10, wherein the one or more vias couple traces within selected layers.

12. A package substrate comprising:
- a thin, flexible, electrically insulating film including a conductor region to mount an integrated circuit;
- a plurality of traces, at least some of which are within the conductor region;
- one or more vias within the film and coupled to corresponding ones of the traces; and
- a plurality of lands on a surface of the film and coupled to the traces, wherein the lands are to mount corresponding pads of the integrated circuit, the plurality of lands including a plurality of signal lands around the periphery of the conductor region, the plurality of lands further including a plurality of power and ground lands within a central core region of the conductor region.

13. The package substrate recited in claim 12, wherein the film is formed of material selected from the group consisting of a polymeric film, polyimide, polyester, polyparabanic acid, epoxy, and fiberglass.

14. The package substrate recited in claim 12, wherein the film comprises a plurality of layers, each of the layers comprising a plurality of traces.

15. The package substrate recited in claim 14, wherein the one or more vias couple traces within selected layers.

* * * * *

UNITED STATES PATENT AND TRADEMARK OFFICE
CERTIFICATE OF CORRECTION

PATENT NO. : 6,800,947 B2
APPLICATION NO. : 09/893036
DATED : October 5, 2004
INVENTOR(S) : Sathe It is certified that error appears in the above-identified patent and that said Letters Patent is hereby corrected as shown below:

The title page, showing an illustrative figure, should be deleted and substitute the attached title page.

Delete drawing sheet 3 and substitute the drawing sheet consisting of Fig 3 as shown on the attached page.

Signed and Sealed this

Twentieth Day of June, 2006

JON W. DUDAS
*Director of the United States Patent and Trademark Office*

(12) United States Patent
Sathe

(10) Patent No.: US 6,800,947 B2
(45) Date of Patent: Oct. 5, 2004

(54) FLEXIBLE TAPE ELECTRONICS PACKAGING

(75) Inventor: Ajit V. Sathe, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/893,036

(22) Filed: Jun. 27, 2001

(65) Prior Publication Data

US 2003/0001287 A1 Jan. 2, 2003

(51) Int. Cl.[7] .............................................. H01L 23/48
(52) U.S. Cl. ...................... 257/780; 257/781; 257/782; 257/784; 257/786
(58) Field of Search ............................ 257/668, 692, 257/693, 694, 695, 696, 697, 698, 699, 700, 701, 702, 703, 780, 781, 782, 786, 686, 783, 784, 785; 438/612, 613, 1.18, 614, 666

(56) References Cited

U.S. PATENT DOCUMENTS

| | | | | |
|---|---|---|---|---|
| 4,701,363 A | * | 10/1987 | Barber | 428/137 |
| 5,045,921 A | * | 9/1991 | Lin et al. | 257/680 |
| 5,354,955 A | * | 10/1994 | Gregor et al. | 174/250 |
| 5,375,042 A | * | 12/1994 | Arima et al. | 361/784 |
| 5,598,033 A | * | 1/1997 | Behlen et al. | 257/686 |
| 5,615,477 A | * | 4/1997 | Sweitzer | 29/840 |
| 5,818,699 A | * | 10/1998 | Fukuoka | 257/704 |
| 5,832,294 A | * | 11/1998 | Reinschmidt | 712/32 |
| 5,939,782 A | * | 8/1999 | Malladi | 257/698 |
| 6,075,710 A | * | 6/2000 | Lau | 257/778 |
| 6,218,729 B1 | * | 4/2001 | Zavrel et al. | 257/698 |
| 6,252,298 B1 | * | 6/2001 | Lee et al. | 257/668 |
| 6,268,568 B1 | * | 7/2001 | Kim | 257/778 |
| 6,329,610 B1 | * | 12/2001 | Takubo et al. | 174/264 |
| 6,365,421 B2 | * | 4/2002 | Debenham et al. | 438/14 |
| 6,407,929 B1 | * | 6/2002 | Hale et al. | 257/724 |
| 6,433,441 B1 | * | 8/2002 | Niwa et al. | 257/784 |
| 6,627,999 B2 | * | 9/2003 | Akram et al. | 257/778 |

OTHER PUBLICATIONS

Prasad, R.P., In: *Surface Mount Technology—Principles and Practice, Second Edition*, Kluwer Academic Publishing, pp. 38–41, (1997).

* cited by examiner

*Primary Examiner*—Eddie Lee
*Assistant Examiner*—Quang Lu
(74) *Attorney, Agent, or Firm*—Schwegman, Lundberg, Woessner & Kluth, P.A.

(57) ABSTRACT

To decrease the weight and the thickness, and to increase the flexibility, of an electronics package, the package includes an integrated circuit (IC) mounted on a flexible tape substrate. In one embodiment, an IC is mounted on a flexible tape substrate using a ball grid array arrangement; however, other arrangements, including lead bonding, can be used. The flexible tape substrate can comprise conductive traces, vias, and patterns of lands on one or more layers. Methods of fabrication, as well as application of the flexible tape package to an electronic assembly, an electronic system, and a data processing system, are also described.

15 Claims, 12 Drawing Sheets